United States Patent
Yamamoto et al.

(10) Patent No.: US 6,388,339 B1
(45) Date of Patent: May 14, 2002

(54) SEALED-BY-RESIN TYPE SEMICONDUCTOR DEVICE AND LIQUID CRYSTAL DISPLAY MODULE INCLUDING THE SAME

(75) Inventors: Seiichi Yamamoto, Nara; Miki Fujiyoshi, Osaka, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/697,599

(22) Filed: Oct. 27, 2000

(30) Foreign Application Priority Data

Oct. 29, 1999 (JP) .......................... 11-310432

(51) Int. Cl.[7] .............................. H01L 23/28
(52) U.S. Cl. ...................... 257/787; 349/151
(58) Field of Search ....................... 257/787; 349/151

(56) References Cited

U.S. PATENT DOCUMENTS 4,643,526 A * 2/1987 Watanable et al. .......... 349/151
6,039,896 A * 3/2000 Miyamoto et al. .......... 252/511
6,108,210 A * 8/2000 Chung ........................ 361/747
6,265,782 B1 * 7/2001 Yamamoto et al. ......... 257/783

FOREIGN PATENT DOCUMENTS

| JP | 1-93155 | 4/1989 |
| JP | 6-224239 | 8/1994 |
| JP | 6-236899 | 8/1994 |
| JP | 8-97334 | 4/1996 |

* cited by examiner

*Primary Examiner*—Nathan Flynn
*Assistant Examiner*—Leonardo Andújar
(74) *Attorney, Agent, or Firm*—Nixon & Vanderhye P.C.

(57) ABSTRACT

A sealed-by-resin type semiconductor device includes a substrate, a lead provided on the substrate, and a semiconductor element provided on the lead by flip chip bonding. The semiconductor element includes a plurality of terminals connected to the lead. The sealed-by-resin type semiconductor device further includes a resin for protecting the plurality of terminals, and the resin has a sufficiently low elasticity modulus that occurrence of undesirable migration is suppressed.

8 Claims, 3 Drawing Sheets

SEALED-BY-RESIN TYPE SEMICONDUCTOR DEVICE AND LIQUID CRYSTAL DISPLAY MODULE INCLUDING THE SAME

BACKGROUND OF THE INVENTION

1. Field of the Invention

The present invention relates to a sealed-by-resin type semiconductor device and a liquid crystal display module including the same. More particularly, the present invention relates to a COF (chip on flexible printed circuit) in which ICs and chips are implemented on a flexible substrate, and a liquid crystal display module including the same.

2. Description of the Related Art

Recently, there is a demand for smaller-sized, lighter, thinner elements for use in electronic devices such as personal digital assistants. One of such elements is a liquid crystal display (hereinafter referred to as LCD) module which is used as an output section of the electronic devices. Ease of incorporation into the devices is highly required.

Some LCD modules are created by the COF technique to meet the above-described demand. In such an LCD module, an IC for driving a liquid crystal (hereinafter referred to as an LC-driving IC) and other chips are mounted on a flexible substrate made of a polyimide film printed with a conductor pattern, and these elements are coupled to an LCD element via an anisotropic conductive film.

FIG. 5 is a plan view of such a COF LCD module. FIG. 6 is a side view of the COF LCD module.

A "sealing resin" herein means a resin which fills between an LC-driving IC and a flexible substrate so as to protect a contact between the LC-driving IC and the flexible substrate.

As shown in FIG. 5, a COF LCD module 400 includes an LCD element 8 and a COF 300. The COF 300 includes a flexible substrate 9 on which an LC-driving IC 1 and a chip 10 are mounted.

The flexible substrate 9 is, for example, fabricated in the following way. A copper foil having a thickness of about 2 to 35 $\mu$m is coated with a precursor of polyimide which is in turn cured. The resultant polyimide film substrate has a thickness of about 10 to 100 $\mu$m. Such a fabricating method is called casting. The substrate is etched to obtain the desired conductor pattern. The substrate is coated with a polyimide resin or an epoxy resin, except for portions of the substrate 9 on which the LC-driving IC 1 and the chip 10 and contacts of the LCD element 8 with the LC-driving IC 1 and the chip 10. The conductor pattern on which a conductor is exposed is plated with Sn, Ni, Au, or the like. In this way, the flexible substrate 9 is fabricated.

As an alternative way to form the conductor pattern, an additive method may be employed. In this case, a sputtered copper is patterned and then thickened by plating.

The COF 300 is, for example, fabricated in the following way. The LC-driving IC 1 and the chip 10 are mounted on the conductor pattern of the flexible substrate 9. The LC-driving IC 1 is implemented by flip chip bonding.

The LC-driving IC 1 includes an Au bump (not shown) which is coupled with the conductor pattern. As a method of coupling the Au bump with the conductor pattern, for example, an Sn—Au alloy coupling method, or a coupling method using an anisotropic conductive film may be adopted.

The Sn—Au alloy coupling method is performed in the following way. The LC-driving IC 1 is provided on the flexible substrate 9 so that the Au bump of the LC-driving IC 1 contacts with the Sn-plated conductor pattern. The Au bump is coupled with the conductor pattern by heating and pressing the flexible substrate 9 from the rear side thereof (9A side). Subsequently, the LC-driving IC 1 is sealed by a sealing resin 4.

The coupling method using an anisotropic conductive film is performed in the following way. The anisotropic conductive film is interposed between the flexible substrate 9 and the LC-driving IC 1. In this situation, the flexible substrate 9 is heated and pressed from the rear side thereof (9A side) so that the Au bump is electrically coupled with the conductor pattern while the Au bump is fixed on the conductor pattern by the cured anisotropic conductive film.

Thereafter, the COF 300 fabricated as described above is conductive-coupled with the LCD element 8 using an anisotropic conductive film or the like, thereby obtaining the LCD module 400.

Recently, the pitch of the Au bump is becoming narrower in order to meet a demand for a higher resolution of liquid crystal display and a smaller area of the LC-driving IC 1. The Au bump is used as the segment output terminal of the LC-driving IC 1.

In order to improve the ease of incorporating the COF LCD module 400 into a device, the coupling strength between the LC-driving IC 1 and the flexible substrate 9 needs to be enhanced and the COF 300 on which the LC-driving IC 1 is mounted needs to be thinner.

The inventors fabricated and studied a prototype of the COF 300, in which the LC-driving IC 1 having an Au bump having a narrower pitch, is mounted on the flexible substrate 9 by the Sn—Au alloy coupling.

As a result, when the pitch of the Au bump in the LC-driving IC 1 is about 70 $\mu$m or less (a gap between the Au bumps is about 30 $\mu$m or less), abnormalities in the liquid crystal display were encountered due to leakage between the Au bumps in a moisture-resistance reliability test in atmosphere having a humidity of about 95% at about 60° C.

The abnormalities in liquid crystal display were investigated to find the causes. As a result, occurrence of migration was recognized between the Au bumps. It was found by elemental analysis that this migration was caused by Au.

In general, it is said that the Au migration is generated by an electric field being applied to a halogen and moisture.

SUMMARY OF THE INVENTION

According to one aspect of the present invention, a sealed-by-resin type semiconductor device includes a substrate; a lead provided on the substrate; and a semiconductor element provided on the lead by flip chip bonding. The semiconductor element includes a plurality of terminals connected to the lead; the sealed-by-resin type semiconductor device further includes a resin for protecting the plurality of terminals; and the resin has a sufficiently low elasticity modulus that occurrence of undesirable migration is suppressed.

In one embodiment of this invention, the elasticity modulus is substantially about 1 GPa or less.

In one embodiment of this invention, the elasticity modulus is substantially about 0.07 GPa or more and about 1 GPa or less.

In one embodiment of this invention, the resin includes a thermosetting resin, an epoxy resin, or a denatured polyimide resin.

In one embodiment of this invention, the resin includes an epoxy resin; and the epoxy resin includes a bisphenol type epoxy resin.

In one embodiment of this invention, the resin includes a denatured polyimide resin; and the denatured polyimide resin includes aromatic tetracarboxylic acid and aromatic diamine.

In one embodiment of this invention, the plurality of terminals include an Au bump.

In one embodiment of this invention, a pitch of the plurality of terminals is substantially about 70 μm or less.

In one embodiment of this invention, the resin has a sufficiently high elasticity modulus that a coupling strength between the substrate and the semiconductor element is sufficient.

According to another aspect of the present invention, a liquid crystal display module includes a sealed-by-resin type semiconductor device including: a substrate; a lead provided on the substrate; and a semiconductor element provided on the lead by flip chip bonding, and a liquid crystal display element coupled with the substrate. The semiconductor element includes a plurality of terminals connected to the lead. The sealed-by-resin type semiconductor device further includes a resin for protecting the plurality of terminals. The resin has a sufficiently low elasticity modulus that occurrence of undesirable migration is suppressed.

In one embodiment of this invention, the liquid crystal display module further includes an anisotropic conductive film for coupling the substrate with the liquid crystal display element.

The inventors conducted an experiment in which an Au bump to which a halogen compound was attached was exposed to high temperature and high humidity. As a result, occurrence of migration was suppressed and a sufficient coupling strength was obtained between the LC-driving IC 1 and the flexible substrate 9 when the elasticity modulus of the sealing resin 4 sealing the LC-driving IC 1 was optimized. This led to achievement of the present invention.

According to the present invention, the electrical coupling reliability of the semiconductor elements and the flexible circuit substrate, such as heat-impact resistance, moisture resistance, and a coupling strength can be enhanced. An epoxy resin or a denatured polyimide resin is used as the sealing resin.

Thus, the invention described herein makes possible the advantages of (1) providing a sealed-by-resin type semiconductor device capable of suppressing migration between Au bumps, and an LCD module including the same and (2) providing a sealed-by-resin type semiconductor device having a sufficient coupling strength between an LC-driving IC and a flexible substrate.

These and other advantages of the present invention will become apparent to those skilled in the art upon reading and understanding the following detailed description with reference to the accompanying figures.

DESCRIPTION OF THE PREFERRED EMBODIMENTS

Embodiments of the present invention will be described with reference to the accompanying drawings.

Figure 1:
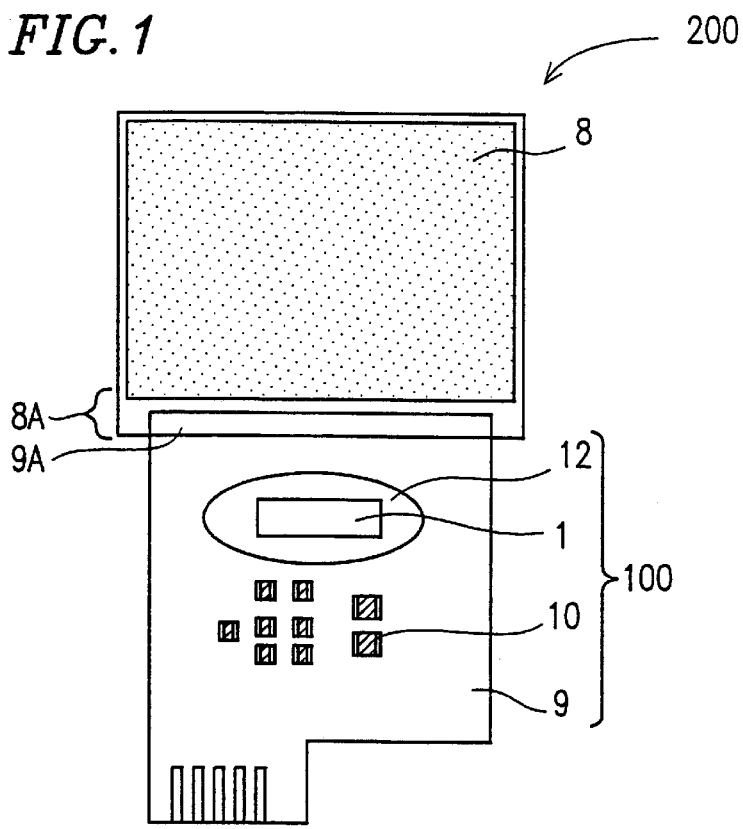
FIG. 1 is a plan view of a COF LCD module according to an embodiment of the present invention.
Figure 2:
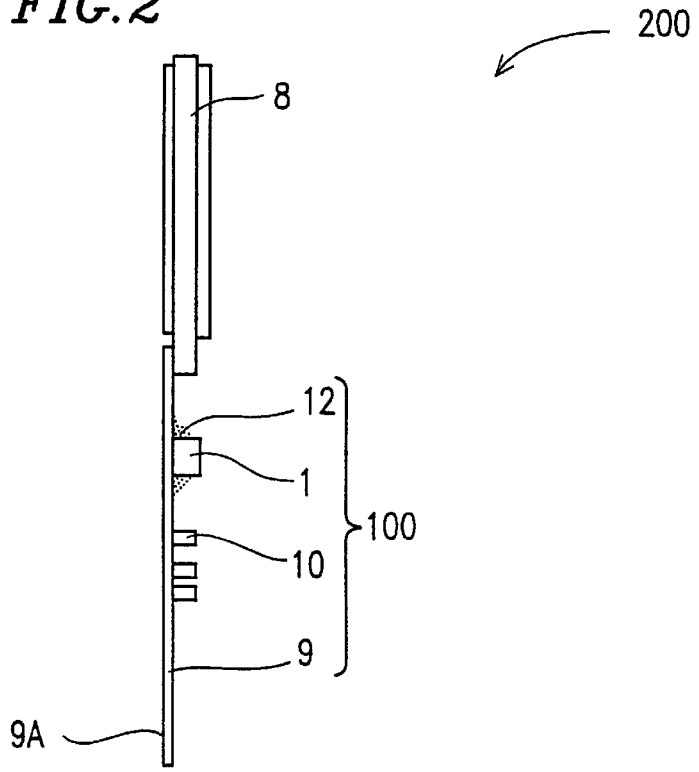
FIG. 2 is a side view of the COF LCD module shown in FIG. 1.

FIG. 1 is a plan view of a COF LCD module 200 according to an embodiment of the present invention. FIG. 2 is a side view of a COF LCD module 200 according to the embodiment of the present invention. The same components as those included in the COF LCD module 400 are indicated by the same reference numerals as those used for the COF LCD module 400. Detailed description is omitted for those components.

The COF LCD module 200 includes an LCD element 8 and a COF 100. The COF 100 includes a flexible substrate 9 on which an LC-driving IC 1 and a chip 10 are mounted.

The COF LCD module 200 according to the embodiment of the present invention is different from the foregoing COF LCD module 400 in that in the COF LCD module 200 the LC-driving IC 1 is sealed by a sealing resin 12, of which the elasticity modulus is optimized, instead of the sealing resin 4.

Figure 3:
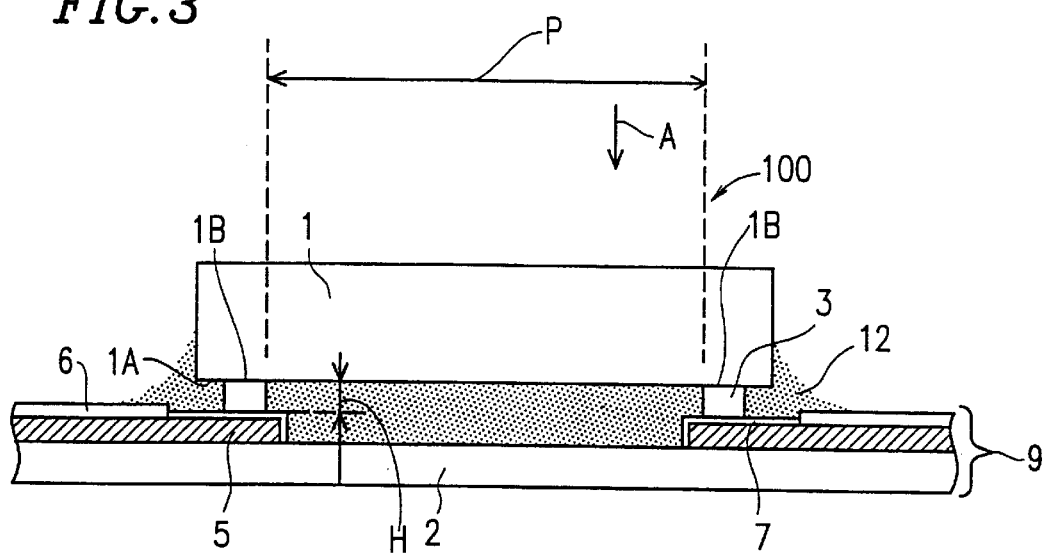
FIG. 3 is a major cross-sectional view of the COF LCD module shown in FIG. 1.

FIG. 3 is a cross-sectional view of a major portion of the COF 100 according to the embodiment of the present invention. The sealing resin 12 seals the LC-driving IC 1.

In the LC-driving IC 1, a given electronic circuit (not shown) and an electrode pad 1B are provided on a rear side 1A of the LC-driving IC 1. The Au bump 3 is provided on the electrode pad 1B. For example, the outer dimensions of the LC-driving IC 1 are about 2 mm×20 mm. The bump height H is about 15 μm. The minimum bump pitch P of the Au bump 3 is about 80 μm.

The flexible substrate 9 includes a polyimide film 2 having a thickness of about 20 to 30 μm, a conductor pattern 5 of Cu provided on the polyimide film 2, a portion on which the LC-driving IC 1 is mounted, a portion on which the chip 10 is mounted, an ink coverlay 6 of polyimide covering portions other than a connecting terminal 9A which connects an LCD element 8 and the COF 100, an Sn plating layer 7 with which the conductor pattern 5 is coated.

The flexible substrate 9 and the LC-driving IC 1 are registered so that the conductor pattern 5 is opposed to the Au bump 3. The LC-driving IC 1 is heated and pressed from the top side thereof (in the direction indicated by arrow A) so as to couple the conductor pattern 5 with the Au bump 3 due to an Sn—Au alloyed junction. The heating temperature is about 280° C. or more which is sufficient so that the Sn plating layer 7 and the Au bump 3 form into an eutectic alloy.

Thereafter, a sealing resin 12 is injected into a gap between the LC-driving IC I and the flexible substrate 9. The sealing resin 12 is cured to seal the gap. The sealing resin 12 has an elasticity modulus which is sufficiently low so as not to generate undesirable migration.

Thereafter, a resin is applied to the LC-driving IC 1 using a dispenser. The resin is heated for about two hours at about 100° C. and then for about one hour at about 150° C. so as to be cured.

Thereafter, a transparent electrode connecting terminal 8A of the LCD element 8 is electrically coupled with a connecting terminal 9A of the flexible substrate 9 via an anisotropic conductive film. Thus, the LCD module 200 is completely fabricated.

EXAMPLES

Example 1

In Example 1, a bisphenol type epoxy resin was used as the sealing resin. Four types of bisphenol type epoxy resins having elasticity modulus of 0.005 GPa, 0.07 GPa, 0.3 GPa, and 1.0 GPa, respectively, were used. The elasticity modulus was measured by a dynamic viscoelasticity method (conducted at a room temperature of about 25° C.).

50 LCD modules were fabricated for each of the four types of bisphenol type epoxy resins having elasticity modulus of 0.005 GPa, 0.07 GPa, 0.3 GPa, and 1.0 GPa, respectively. All the LCD modules were placed in a moisture-resistance reliability test bath having a temperature of about 60° C. and a humidity of about 95%. The rate of occurrence of an LCD abnormality, which is caused by leakage between the Au bumps due to the migration, was evaluated after about 1000 hours had passed.

Figure 4:
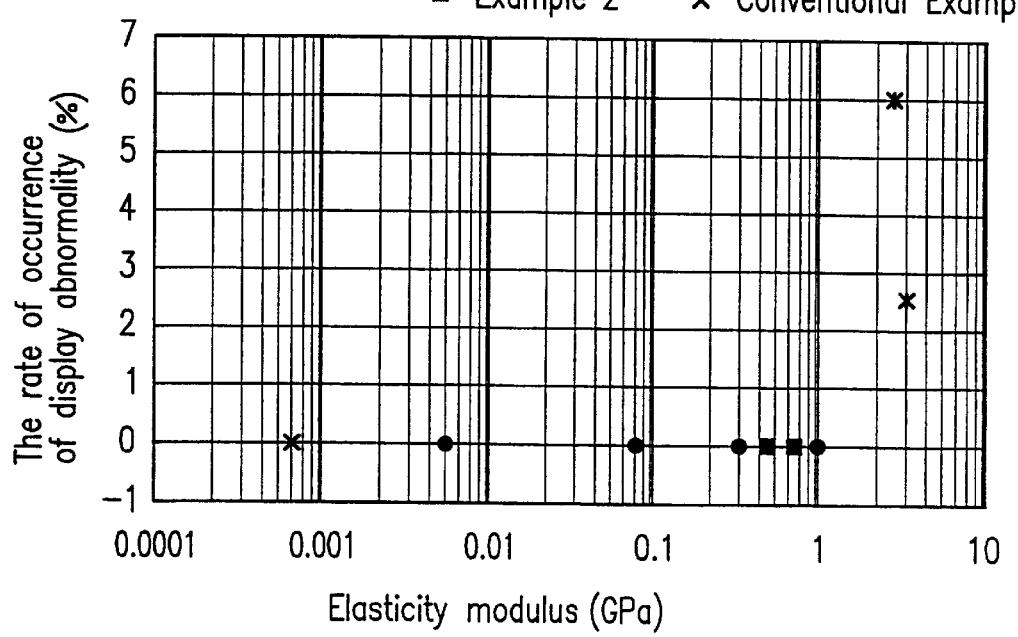
FIG. 4 is a graph showing the rate of occurrence of display abnormality due to migration in the COF LCD module shown in FIG. 1.
Figure 5:
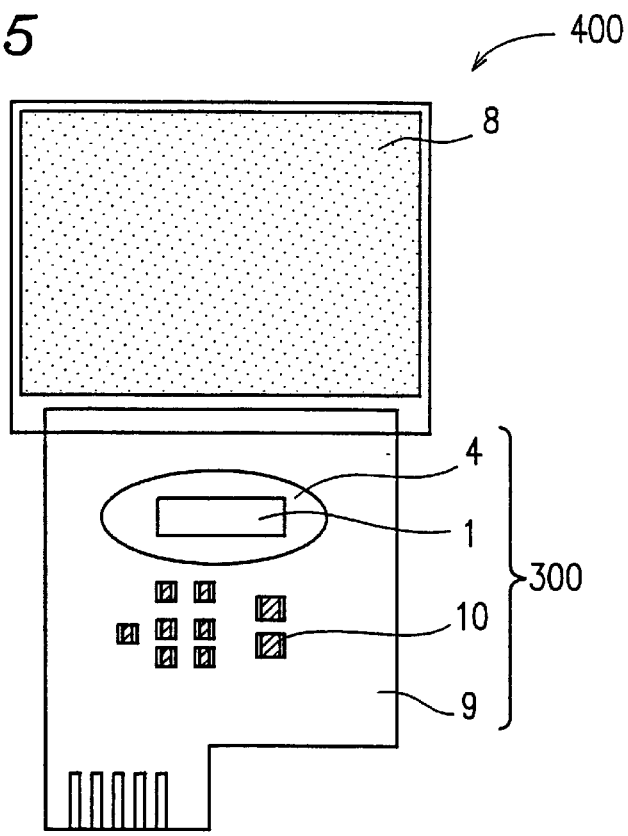
FIG. 5 is a plan view of a conventional COF LCD module.
Figure 6:
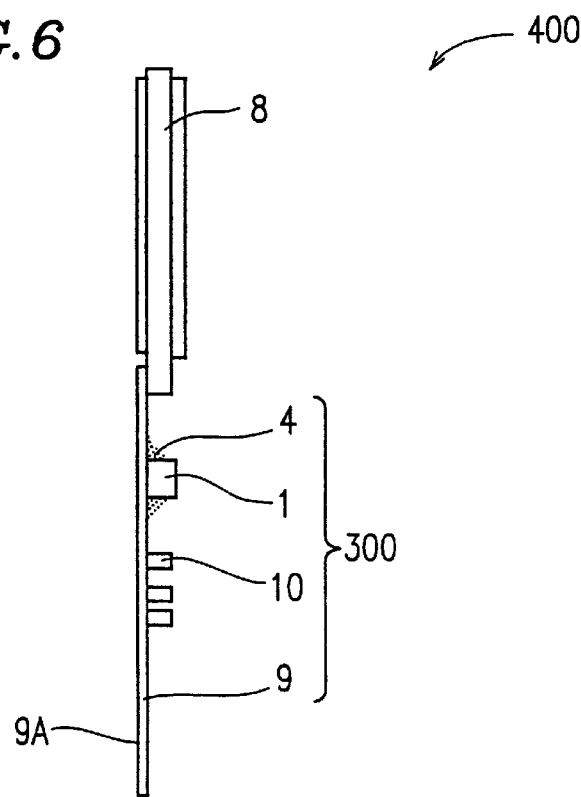
FIG. 6 is a side view of the COF LCD module shown in FIG. 5.

FIG. 4 is a graph showing the rate of occurrence of the LCD abnormality that is caused by leakage between the Au bumps due to the migration, in Example 1. As is seen from FIG. 4, when the bisphenol type epoxy resin was used as the sealing resin 12 in Example 1, there were substantially no LCD abnormality that is caused by leakage between the Au bumps due to the migration.

The coupling strength between the LC-driving IC 1 and the flexible substrate 9 was evaluated. The flexible substrate 9 was bent into a 90° angle while the LC-driving IC 1 was fixed on the flexible substrate 9. A load was increasingly imposed on the LC-driving IC 1 while the LCD element 8 was displaying. In this case, the value of the load, which starts to generate the display abnormality in the LCD element 8, was determined.

The inventors' previous study has found that when the value of the load, which starts to generate the display abnormality in the LCD element 8, is about 500 gf or more, there are substantially no adverse problems in the process of incorporating the COF LCD module into a device.

The average values of the results obtained by measuring 10 COF LCD modules 200 are shown in Table 1. Table 1 shows the values of loads which start to generate the display abnormality in the LCD elements having the respective elasticity.

Example 2

In Example 2, a denatured polyimide including aromatic tetracarboxylic acid and aromatic diamine was used as the sealing resin. Two types of the denatured polyimide having elasticity modulus of 0.45 GPa and 0.65 GPa, respectively. The elasticity modulus was measured by the dynamic viscoelasticity method, similar to Example 1 (conducted at a room temperature of about 25° C.)

50 COF LCD modules 200 were fabricated for each of the two types of the denatured polyimide having elasticity modulus of 0.45 GPa and 0.65 GPa, respectively, in a way similar to Example 1. The sealing resin was heated for two hours at 90° C. and then for two hours at 150° C.

The COF LCD modules thus fabricated were subjected to a moisture-resistance reliability test similar to that of Example 1. The results are shown in FIG. 4. As is seen from FIG. 4, when the denatured polyimide was used as the sealing resin 12 in Example 2, there were substantially no LCD abnormality caused by leakage between the Au bumps due to the migration.

The coupling strength between the LC-driving IC 1 and the flexible substrate 9 was evaluated in a way similar to that of Example 1 and the results are shown in Table 1. In the case of the denatured polyimide used as the sealing resin 12 in Example 2, the obtained values of loads are 500 gf or more. The denatured polyimide having elasticity modulus of 0.07 GPa or more and 1 GPa or less has the same effect as that of Example 1.

Conventional Example 1

In Conventional Example 1, two types of epoxy resins having elasticity modulus of 2.5 GPa and 3.1 Gpa, which are higher than the elasticity modulus of the sealing resins of Examples 1 and 2, were used.

Similar to Example 1, 50 COF LCD modules were fabricated for each elasticity modulus. The sealing resins were cured for two hours at 120° C. and then for two hours at 150° C. All the COF LCD modules were subjected to a moisture-resistance reliability test similar to that of Example 1.

The results are shown in FIG. 4. As is seen from FIG. 4, in the case of the sealing resins of Conventional Example 1 having an elasticity modulus which is higher than the elasticity modulus of the sealing resins of Examples 1 and 2, there is observed an LCD abnormality caused by leakage between the Au bumps due to the migration.

Conventional Example 2

In Conventional Example 2, a silicone resin having an elasticity modulus of 0.0006 GPa, which is lower than the elasticity modulus of the sealing resins of Examples 1 and 2, was used.

TABLE 1

| Elasticity | Example 1 (epoxy) | | | | Example 2 (polyimide) | | Conventional example 1 (epoxy) | | Conventional example 2 (silicone) |
|---|---|---|---|---|---|---|---|---|---|
| modulus (GPa) | 0.005 | 0.07 | 0.3 | 1.0 | 0.45 | 0.65 | 2.5 | 3.1 | 0.0006 |
| Average value (gf) | 380 | 730 | 1220 | 1380 | 950 | 970 | 1510 | 1500 | 210 |
| Maximum value (gf) | 410 | 550 | 1530 | 1610 | 1160 | 1210 | 1670 | 1710 | 260 |
| Minimum value (gf) | 350 | 690 | 1080 | 1100 | 880 | 860 | 1330 | 1350 | 180 |

As shown in Table 1, in the case of the COF LCD modules 200 of an epoxy resin having an elasticity modulus of 0.07 GPa or more and 1.0 GPa or less, the values of loads are 500 gf or more.

As compared with conventional sealing resins having higher elasticity modulus, the epoxy resins used in Example 1 have shorter cure time, thereby improving productivity.

Similar to Example 1, 50 COF LCD modules were fabricated. The sealing resin was cured for four hours at 150° C. The COF LCD modules were subjected to a moisture-resistance reliability test similar to that of Example 1.

The results are shown in FIG. 4. As is seen from FIG. 4, in the case of the sealing resins of Conventional Example 2, there is substantially no LCD abnormality caused by leakage between the Au bumps due to the migration.

The coupling strength between the LC-driving IC 1 and the flexible substrate 9 was evaluated in a way similar to that of Example 1 and the results are shown in Table 1. In the case of the resin of Conventional is Example 2, the obtained value of a load does not exceed 500 gf.

As described above, the present invention can provide the sealed-by-resin type semiconductor device capable of suppressing occurrence of migration between the Au bumps, and an LCD module including the same.

Further, the present invention can provide the sealed-by-resin type semiconductor device having a sufficient coupling strength between the LC-driving IC and the flexible substrate, and an LCD module including the same.

In the sealed-by-resin type semiconductor device of the present invention, the epoxy resin or denatured polyimide resin having an elasticity modulus of 0.07 GPa or more and 1 GPa or less is used as a sealing resin protecting semiconductor elements. Therefore, it is possible to suppress occurrence of migration which is responsible for the leakage between the Au bumps. Moreover, a coupling strength between the semiconductor elements and the flexible substrate is sufficient, which is an excellent, characteristic effect.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A seal-by-resin type semiconductor device comprising:
   a substrate;
   a lead provided on the substrate; and
   a semiconductor element provided on the lead by flip chip bonding,
      wherein the semiconductor element includes a plurality of terminals connected to the lead;
      the sealed-by-resin type semiconductor device further comprising a resin for protecting the plurality of terminals;
      wherein the resin has a sufficiently low elasticity modulus so that occurrence of undesirable migration is suppressed; and
      wherein the resin includes a denatured polyimide resin, and the denatured polyimide resin includes aromatic tetracarboxylic acid and aromatic diamine.

2. A sealed-by-resin type semiconductor device according to claim 1, wherein the elasticity modulus is substantially about 1 GPa or less.

3. A sealed-by-resin type semiconductor device according to claim 2, wherein the elasticity modulus is substantially about 0.07 GPa or more and about 1 GPa or less.

4. A sealed-by-resin type semiconductor device according to claim 1, wherein the plurality of terminals include an Au bump.

5. A sealed-by-resin type semiconductor device according to claim 1, wherein a pitch of the plurality of terminals is substantially about 70 $\mu$m or less.

6. A sealed-by-resin type semiconductor device according to claim 1, wherein the resin has a sufficiently high elasticity modulus that a coupling strength between the substrate and the semiconductor element is sufficient.

7. A liquid crystal display module comprising:
   a sealed-by-resin type semiconductor device including:
   a substrate;
   a lead provided on the substrate; and
   a semiconductor element provided on the lead by flip chip bonding,
      wherein the semiconductor element includes a plurality of terminals connected to the lead;
      the sealed-by-resin type semiconductor device further including a resin for protecting the plurality of terminals;
      wherein the resin has a sufficiently low elasticity modulus so that occurrence of undesirable migration is suppressed;
      a liquid crystal display element coupled to the substrate; and
      wherein the resin includes a denatured polyimide resin, and the denatured polyimide resin includes aromatic tetracarboxylic acid and aromatic diamine.

8. A liquid crystal display module according to claim 7 further including an anisotropic conductive film for coupling the substrate with the liquid crystal display element.

* * * * *